US008288185B2

(12) United States Patent
Kim et al.

(10) Patent No.: US 8,288,185 B2
(45) Date of Patent: Oct. 16, 2012

(54) SEMICONDUCTOR DEVICES AND METHODS OF FORMING THE SAME

(75) Inventors: In Gyoo Kim, Daejeon (KR); Dae Seo Park, Incheon (KR); Jun Taek Hong, Seoul (KR); Gyungock Kim, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 259 days.

(21) Appl. No.: 12/788,542

(22) Filed: May 27, 2010

(65) Prior Publication Data

US 2011/0133306 A1      Jun. 9, 2011

(30) Foreign Application Priority Data

Dec. 9, 2009 (KR) ........................ 10-2009-0121653

(51) Int. Cl.
  *H01L 21/00* (2006.01)

(52) U.S. Cl. ............ 438/31; 438/42; 438/405; 438/425; 257/E21.537; 257/E21.55; 257/E21.564; 257/E33.011

(58) Field of Classification Search .................... 438/57, 438/405, 424, 425, 426, 435, 31, 42, 39, 438/45, 69, 407, 412, 440, 444, 452; 257/506, 257/522, E33.005, E33.006, E33.011, E21.553, 257/E21.537, E21.546, E21.548, E21.55, 257/E21.554, E21.564
See application file for complete search history.

(56) References Cited

U.S. PATENT DOCUMENTS

| 6,277,703 | B1 * | 8/2001 | Barlocchi et al. ............. 438/412 |
| 7,470,559 | B2 * | 12/2008 | Jouan et al. ..................... 438/65 |
| 7,682,926 | B2 * | 3/2010 | Jang .............................. 438/407 |
| 7,790,567 | B2 * | 9/2010 | Kwon et al. ................... 438/423 |
| 8,017,420 | B2 * | 9/2011 | Kim et al. ....................... 438/31 |

FOREIGN PATENT DOCUMENTS

| KR | 1020040067939 A | 7/2004 |
| KR | 1020090064929 A | 6/2009 |

OTHER PUBLICATIONS

Won Ick Jang et al., "Fabrication of MEMS devices by using anhydrous HF gas-phase etching with alcoholic vapor," Journal of Micromechanics and Microengineering, 2002, pp. 297-306, vol. 12, IOP Publishing Ltd, United Kingdom.

* cited by examiner

*Primary Examiner* — Matthew Landau
*Assistant Examiner* — Joseph C Nicely

(57) ABSTRACT

Provided are a semiconductor device and a method of forming the same. According to the method, a first buried oxide layer is locally formed in a semiconductor substrate and a core semiconductor pattern of a line form, a pair of anchor-semiconductor patterns and a support-semiconductor pattern are formed by patterning a semiconductor layer on the first buried oxide layer to expose the first buried oxide layer. The pair of anchor-semiconductor patterns contact both ends of the core semiconductor pattern, respectively, and the support-semiconductor pattern contacts one sidewall of the core semiconductor pattern, the first buried oxide layer below the core semiconductor pattern is removed. At this time, a portion of the first buried oxide layer below each of the anchor-semiconductor patterns and a portion of the first buried oxide layer below the support-semiconductor pattern remain. A second buried oxide layer is formed to fill a region where the first buried oxide layer below the core semiconductor pattern.

14 Claims, 17 Drawing Sheets

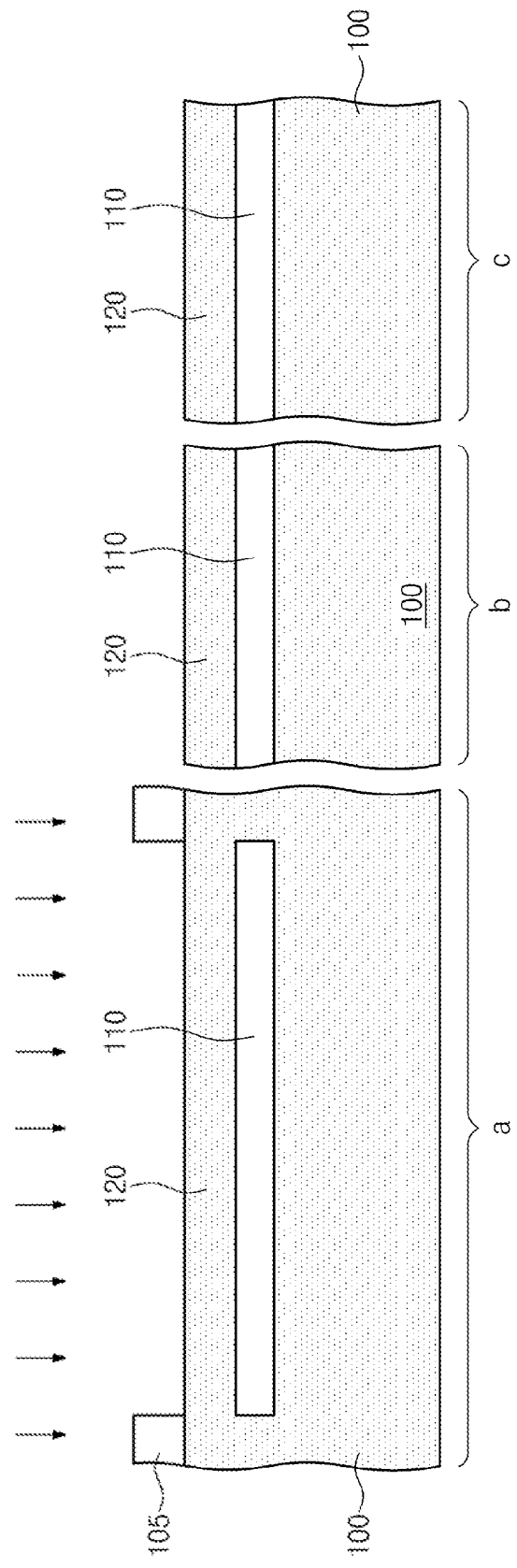

Fig. 2A

SEMICONDUCTOR DEVICES AND METHODS OF FORMING THE SAME

CROSS-REFERENCE TO RELATED APPLICATIONS

This U.S. non-provisional patent application claims priority under 35 U.S.C. §119 of Korean Patent Application No. 10-2009-0121653, filed on Dec. 9, 2009, the entire contents of which are hereby incorporated by reference.

BACKGROUND OF THE INVENTION

The present invention disclosed herein relates to a semiconductor device and a method of forming the same.

As a way of solving various limitations of a bulk silicon substrate, suggested was a Silicon-On-Insulator (SOI) substrate. The SOI substrate includes a thin silicon layer on a buried oxide layer. Since a semiconductor device is formed on the thin silicon layer, the SOI substrate may be advantageous to miniaturization and/or a high speed of the semiconductor device. However, the SOI substrate is expensive due to difficult manufacturing processes, and also the buried oxide layer of the SOI substrate is horizontally disposed on an entire surface of the SOI substrate.

In addition, as electronics industries are highly developed, a demand on a high-speed semiconductor device is being increased. However, there are various limitations in improving an operating speed of a semiconductor device due to heating caused by the high degree of integration of the semiconductor device and the speed limit of electrical data communication. Accordingly, suggested are methods in which an optical communication technology for realizing data communication through an optical signal is applied to a semiconductor device. For example, the semiconductor device may include an electronic device and an optical device to which the optical communication technology is applied. For example, the optical device may use a refractive index difference between silicon and silicon oxide. Since the semiconductor device including these multi-functional devices is manufactured with devices having each function, various factors that may deteriorate their reliability can occur.

SUMMARY OF THE INVENTION

The present invention provides a method of forming a semiconductor device having excellent reliability.

The present invention also provides a semiconductor device having excellent reliability.

Embodiments of the present invention provide methods of forming a semiconductor device, the method including: forming a first buried oxide layer locally in a semiconductor substrate; forming a core semiconductor pattern of a line form, a pair of anchor-semiconductor patterns contacting both ends of the core semiconductor pattern, respectively, and a support-semiconductor pattern contacting one sidewall of the core semiconductor pattern by patterning a semiconductor layer on the first buried oxide layer to expose the first buried oxide layer; removing the first buried oxide layer below the core semiconductor pattern by performing an isotropic etching process and leaving a portion of the first buried oxide layer below each of the anchor-semiconductor patterns and a portion of the first buried oxide layer below the support-semiconductor pattern; and forming a second buried oxide layer filling a region where the first buried oxide layer below the core semiconductor pattern is removed, the second buried oxide layer surrounding the core semiconductor pattern.

In some embodiments, the second buried oxide layer may be formed by a thermal oxidation process.

In other embodiments, the support-semiconductor pattern may contact the core semiconductor pattern after the forming of the second buried oxide layer.

In still other embodiments, a portion of the support-semiconductor pattern, adjacent to the core semiconductor pattern, may be completely oxidized by the thermal oxidation process.

In even other embodiments, a thickness of a portion of the second buried oxide layer between the core semiconductor pattern and the substrate may be formed thicker than a thickness of the first buried oxide layer.

In yet other embodiments, the support-semiconductor pattern may include a body portion and a plurality of connection portions that extend from the body portion and contact the one sidewall of the core semiconductor pattern. The plurality of connection portions are spaced apart from each other.

In further embodiments, the support-semiconductor pattern may extend in a direction perpendicular to a longitudinal direction of the core semiconductor pattern; the support-semiconductor pattern may include a first portion having a uniform width and a second portion interposed between the first portion and the core semiconductor pattern and having a tapered form; and a surface of the second portion, contacting the core semiconductor pattern, may be narrower than a surface of the second portion contacting the first portion.

In still further embodiments, the support-semiconductor pattern may be a rectangle form that extends in a direction perpendicular to a longitudinal direction of the core semiconductor pattern.

In even further embodiments, the support-semiconductor pattern may be formed in plural on the semiconductor substrate, the core semiconductor pattern may include a first sidewall and a second sidewall facing each other, and the support-semiconductor patterns may include a first support-semiconductor pattern contacting the first sidewall and a second support-semiconductor pattern contacting the second sidewall.

In yet further embodiments, the first support-semiconductor pattern and the second support-semiconductor pattern may overlap each other in a direction perpendicular to a longitudinal direction of the core semiconductor pattern.

In yet further embodiments, the first support-semiconductor pattern and the second support-semiconductor pattern may do not overlap in a direction perpendicular to the longitudinal direction of the core semiconductor pattern.

In yet further embodiments, the first buried oxide layer may be formed using a Separation by IMplanted OXgen (SIMOX) method.

In yet further embodiments, the method may further include after the forming of the second buried oxide layer, exposing the top surface of the core semiconductor pattern by removing a portion of the second buried oxide layer on the top surface of the core semiconductor pattern.

In yet further embodiments, the isotropic etching process may include a wet etching process and a dry isotropic etching process, which are sequentially performed.

In other embodiments of the present invention, semiconductor devices include: a core semiconductor pattern disposed on a substrate and having a line form; a pair of anchor-semiconductor patterns disposed on the substrate and contacting both ends of the active semiconductor pattern, respectively; a support-semiconductor pattern disposed on the substrate at one side of the active semiconductor pattern: an anchor buried oxide pattern interposed between each of the anchor-semiconductor patterns and the substrate; a support buried oxide pattern interposed between the support-semiconductor pattern and the substrate; and a core buried oxide layer interposed between the core semiconductor pattern and the substrate and having a thicker thickness than the support and anchor buried oxide patterns.

In some embodiments, the core buried oxide layer may be formed of a thermal oxide, and the anchor and support buried oxide patterns may be formed of an oxide that is formed using a SIMOX method.

In other embodiments, the core buried oxide layer may extend to cover both sidewalls of the core semiconductor pattern.

In still other embodiments, the core buried oxide layer may further extend to cover a top surface of the core semiconductor pattern.

In even other embodiments, the support-semiconductor pattern may contact one sidewall of the core semiconductor pattern.

In yet other embodiments, the support-semiconductor pattern may be laterally spaced apart from the core semiconductor pattern and the core buried oxide layer may extend to be interposed between the core semiconductor pattern and the support-semiconductor pattern.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 1A through 3A are plan views illustrating a method of forming a semiconductor device according to an embodiment of the present invention;

FIGS. 1B through 3B are sectional views taken along the lines I-I', II-II', and III-III' of the FIGS. 1A through 3A to illustrate a method of forming a semiconductor device according to an embodiment of the present invention;

DETAILED DESCRIPTION OF PREFERRED EMBODIMENTS

Figure 1A:
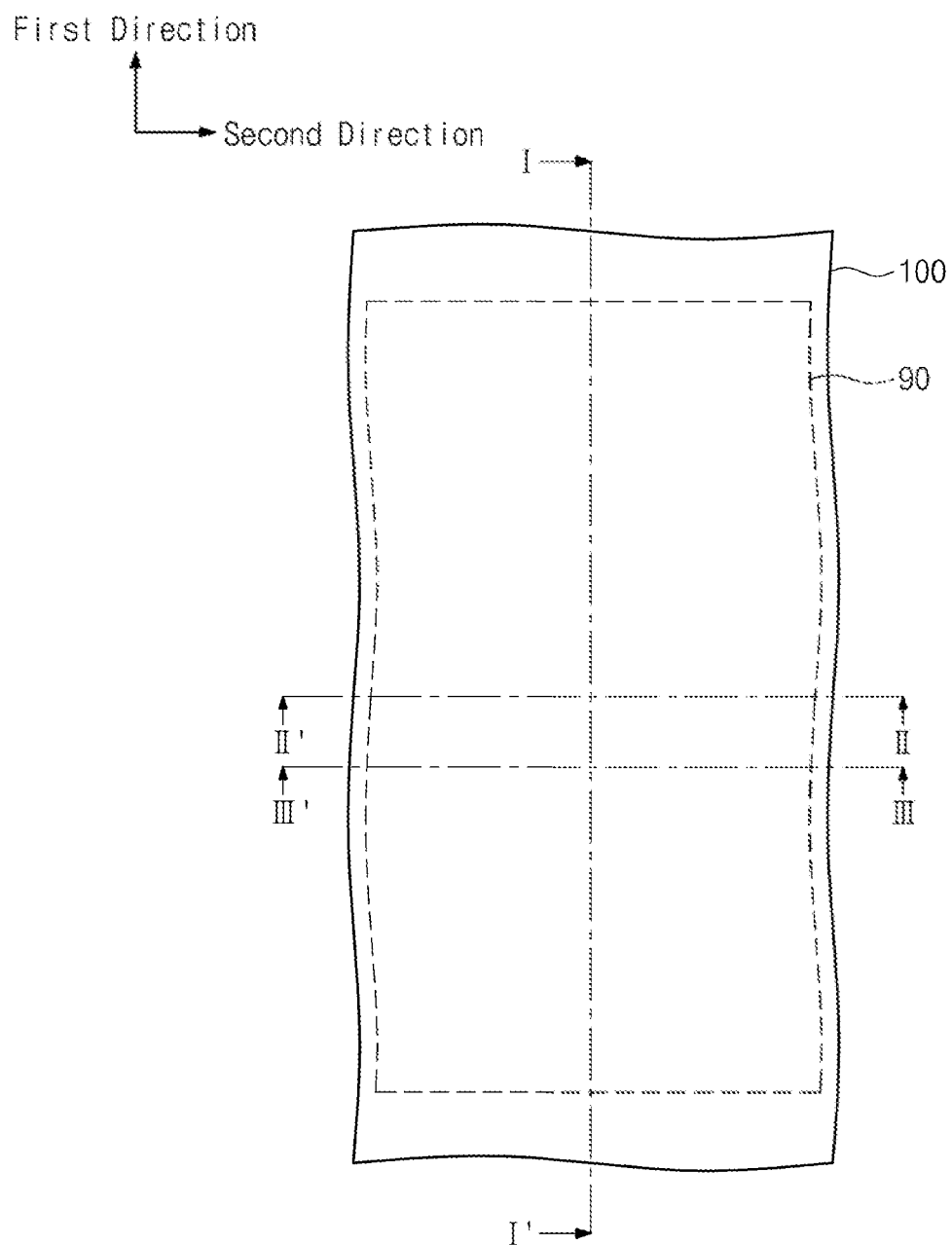

The objects, other objectives, features, and advantages of the present invention will be understood without difficulties through preferred embodiments below related to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the specification, it will be understood that when a layer (or film) is referred to as being 'on' another layer or substrate, it can be directly on the other layer or substrate, or intervening layers may also be present. Also, in the figures, the dimensions of layers and regions are exaggerated for clarity of illustration. Also, though terms like a first, a second, and a third are used to describe various regions and layers in various embodiments of the present invention, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof. In the specification, 'and/or' means that it includes at least one of listed components. Like reference numerals refer to like components throughout the specification.

FIGS. 1A through 3A are plan views illustrating a method of forming a semiconductor device according to an embodiment of the present invention. FIGS. 1B through 3B are sectional views taken along the lines I-I', II-II', and III-III' of the FIGS. 1A through 3A to illustrate a method of forming a semiconductor device according to an embodiment of the present invention. In the FIGS. 1B through 3B, the reference letter "a" represents a sectional view taken along the line I-I'. The reference letter "b" represents a sectional view taken along the line II-II'. The reference letter "c" represents a sectional view taken along the line III-III'.

Referring to FIGS. 1A and 1B, a semiconductor substrate 100 including a specific region 90 is prepared. The specific region 90 is a region where the following first buried oxide layer is formed. The specific region 90 corresponds to a portion of the semiconductor substrate 100. That is, the semiconductor substrate 100 may include another region where the first buried oxide layer is not formed. The specific region 90 may correspond to a region where an optical device is formed in. The semiconductor substrate 100 may be a silicon substrate, a silicon-germanium substrate, a germanium substrate, or a compound semiconductor substrate.

A first buried oxide layer 110 is formed in the semiconductor substrate 100 of the specific region 90. The first buried oxide layer 110 is formed at a specific depth from the top surface of the semiconductor substrate 100. In more detail, the top surface of the first buried oxide layer 110 is spaced below apart from the top surface of the semiconductor substrate 100. Accordingly, a semiconductor layer 120 is disposed on the first buried oxide layer 110. The semiconductor layer 120 corresponds to a portion of the semiconductor substrate 100 disposed between the first buried oxide layer 110 and the top surface of the semiconductor substrate 100.

The first buried oxide layer 110 may be formed using a Separation by IMplanted OXgen (SIMOX) method. Specifically, a mask pattern 105 may be formed on the semiconductor substrate 100. The mask pattern 105 includes an opening that expose the semiconductor substrate 100 of the specific region 90. The mask pattern 105 covers the top surface of the semiconductor substrate 100 except for the specific region 90. The mask pattern 105 may be formed of photoresist, oxide, nitride and/or a poly crystalline semiconductor. The first buried oxide layer 110 may be formed by implanting oxygen ions using the mask pattern 105 as an ion implantation mask. Later, the mask pattern 105 may be removed. After the removing of the mask pattern 105, a thermal treatment process may be performed on the semiconductor substrate 100. The implanted oxygen may be combined with semiconductor elements by the thermal treatment process.

Figure 2A:
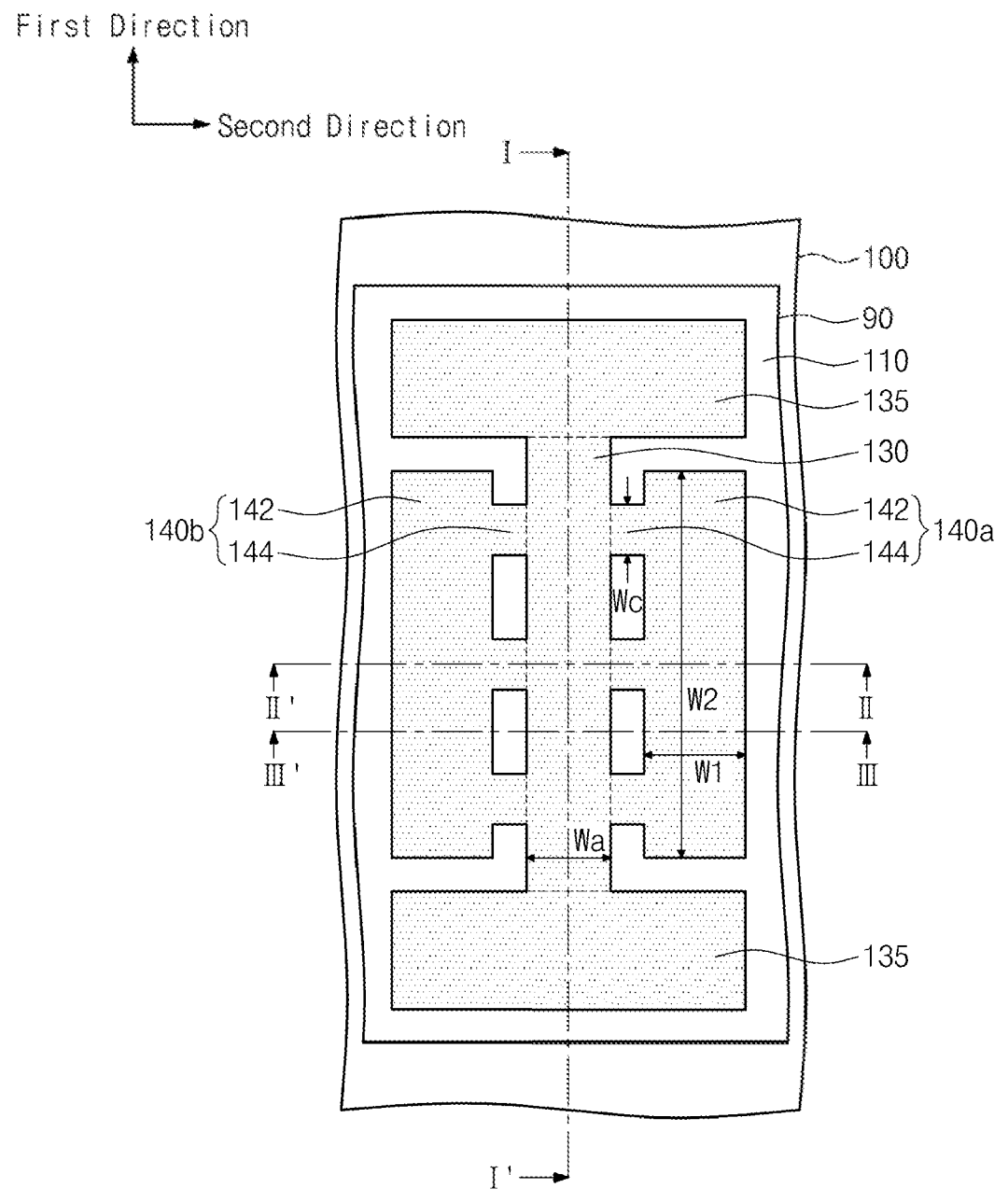
Figure 2B:
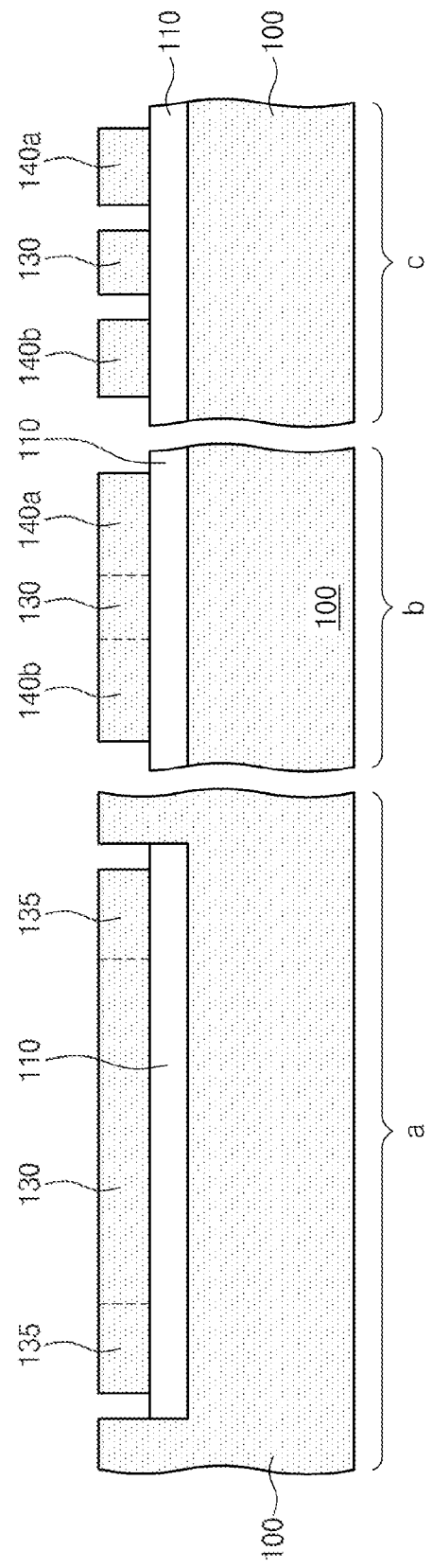

Referring to FIGS. 2A and 2B, the semiconductor layer 120 is patterned until the first buried oxide layer 110 is exposed. Accordingly, a core semiconductor pattern 130, a pair of anchor-semiconductor patterns 135, and at least one support-semiconductor pattern 140a and 140b are formed. The core semiconductor pattern 130 may be a line form. The core semiconductor pattern 130 may extend in a first direction. The first direction is parallel to the top surface of the semiconductor substrate 100. Accordingly, the first direction corresponds to a longitudinal direction of the core semiconductor pattern 130. The pair of anchor-semiconductor patterns 135 contacts the both ends of the core semiconductor pattern 130, respectively. The anchor-semiconductor patterns 135 may a rectangle form that extends in a second direction perpendicular to the first direction. The second direction is also parallel to the top surface of the semiconductor substrate 100. The second direction corresponds to a width direction perpendicular to the longitudinal direction of the core semiconductor pattern 130.

The support-semiconductor pattern 140a or 140b contacts one sidewall of the core semiconductor pattern 130. In more detail, a first support-semiconductor pattern 140a is disposed on the first buried oxide layer 110 at the first side of the core semiconductor pattern 130, and a second support-semiconductor pattern 140b is disposed on the first buried oxide layer 110 at the second side of the core semiconductor pattern 130. The first support-semiconductor pattern 140a contacts the first sidewall of the core semiconductor pattern 130, and the second support-semiconductor pattern 140b contacts the second sidewall of the core semiconductor pattern 130.

The first support-semiconductor pattern 140a may include a body portion 142 of a rectangle form extending in the first direction and a plurality of connection portions 144 extending from the body portion 142 and contacting the first sidewall of the core semiconductor pattern 130. The connection portions 144 of the first support-semiconductor pattern 140a are spaced apart from each other. The body portion 142 has the first width W1 in the first direction and the second width W2 in the second direction. At this point, the first and second widths W1 and W2 of the body portion 142 may be greater than the width Wa of the core semiconductor pattern 130 in the second direction. A width Wc of each of the connection portions 144 in the first direction may be less than the width Wa of the core semiconductor pattern 130.

The second support-semiconductor pattern 140b and the first support-semiconductor pattern 140a may be symmetric with respect to the core semiconductor pattern 130. For example, the second support-semiconductor pattern 140b may include a body portion 142 and a plurality of connection portions 144. The connection portions 144 of the second support-semiconductor pattern 140b contact the second sidewall of the core semiconductor pattern 130.

Figure 3A:
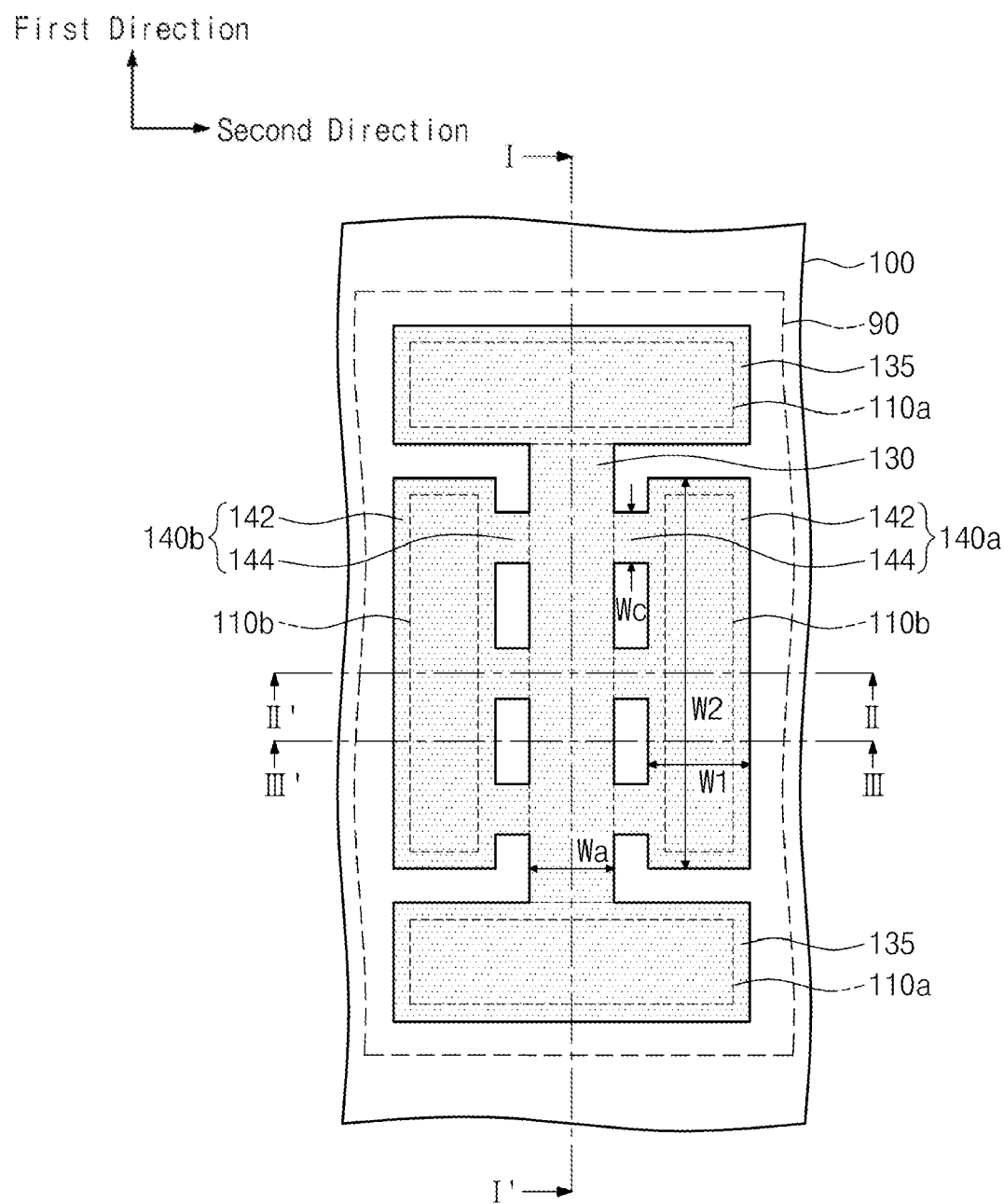
Figure 3B:
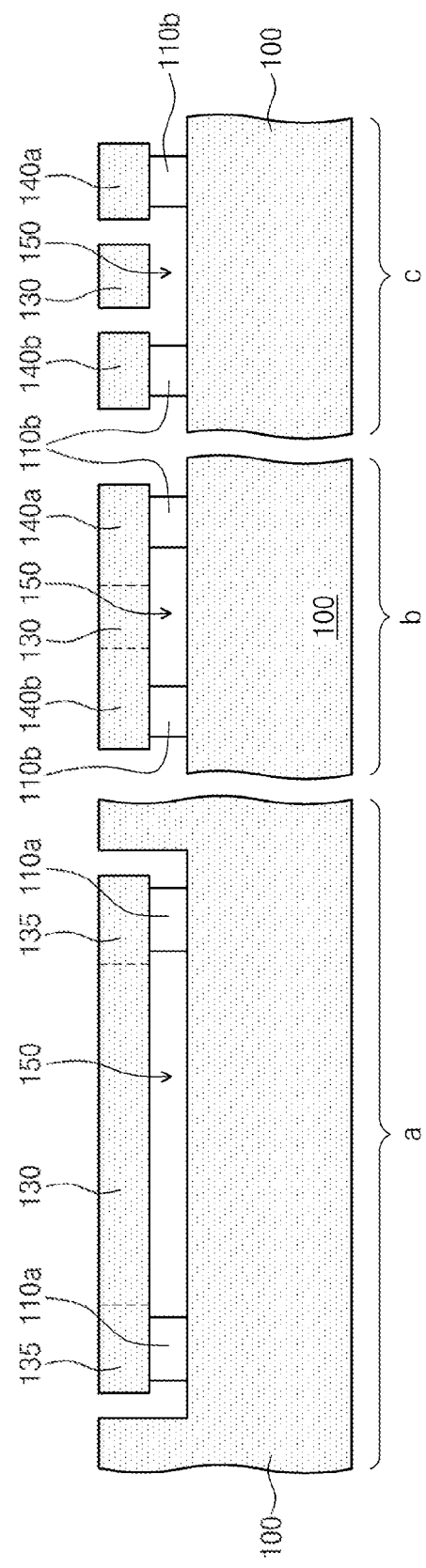

Referring to FIGS. 3A and 3B, an isotropic etching process is performed to the exposed first buried oxide layer 110, such that the first buried oxide layer 110 below the core semiconductor pattern 130 is removed. At this point, a first portion 110a of the first buried oxide layer 110 below each anchor-semiconductor pattern 135 and a second portion 110b of the first buried oxide layer 110 below each support-semiconductor pattern 140a or 140b remain. An empty region 150 is formed by removing the first buried oxide layer 110 below the core semiconductor pattern 130. The remaining first portion 110a of the first buried oxide layer 110 is defined as an anchor buried oxide pattern 110a and the remaining second portion 110b of the first buried oxide layer 110 is defined as a support buried oxide pattern 110b. The support buried oxide pattern 110b may be confinedly disposed below the body portion 142. That is, the first buried oxide layer 110 below the connection portion 144 may be removed. Since the width Wc of the connection portion 144 may be less than the width Wa of the core semiconductor pattern 130, the first buried oxide layer 110 below the connection portion 144 may be removed. In this case, the empty region 150 may extend below the connection portion 144.

As mentioned above, the first buried oxide layer 110 below the core semiconductor pattern 130 is removed. Accordingly, the empty region 150 below the core semiconductor pattern 130 is formed. That is, the core semiconductor pattern 130 may be spaced above apart from the semiconductor substrate 100. The core semiconductor pattern 130 is supported by the support-semiconductor patterns 140a and 140b. In more detail, the core semiconductor pattern 130 is supported by the support buried oxide patterns 110b and the support-semiconductor patterns 140a and 140b. Furthermore, the core semiconductor pattern 130 is supported by the anchor-semiconductor pattern 135 and the anchor buried oxide pattern 110a.

The core semiconductor pattern 130 may have a line form. At this point, the support-semiconductor patterns 140a and 140b contact the sidewalls of the core semiconductor pattern 130 having a line form to support the core semiconductor pattern 130. Thereby, a bending phenomenon of the core semiconductor pattern 130 can be prevented after the performing of the isotropic etching process.

If the support-semiconductor patterns 140a and 140b are omitted, the core semiconductor pattern 130 having a line form only can be supported by the anchor-semiconductor pattern 135 connected to the both ends of the core semiconductor pattern 130. In this case, the core semiconductor pattern 130 of a line form may sink down and may be bent. In this case, reliability of the semiconductor device may be greatly deteriorated.

However, according to the present invention, since the support-semiconductor patterns 140a and 140b are connected to the both sidewalls of the core semiconductor pattern 130 having a line form, the bending phenomenon of the core semiconductor pattern 130 can be minimized.

The isotropic etching process may include two steps. In more detail, the isotropic etching process may include a wet etching process and a dry isotropic etching process, which are sequentially performed. After a portion of the first buried oxide layer 110 below the core semiconductor pattern 130 may be removed using the wet etching process, the remaining portion of the first buried oxide layer 110 below the core semiconductor pattern 130 may be removed using the dry isotropic etching process. The dry isotropic etching process may be performed using an etchant of a gas state. The etchant of a gas state may be provided to the first buried oxide layer 110 through a diffusion method. For example, when the first buried oxide layer 110 is formed of silicon oxide, the dry isotropic etching process may use a mixture gas including hydrofluoric acid gas and methanol gas.

According to one embodiment of the present invention, the isotropic etching process may be performed with only the wet etching process. Unlike this, the isotropic etching process may be performed only with the dry isotropic etching process.

Figure 7A:
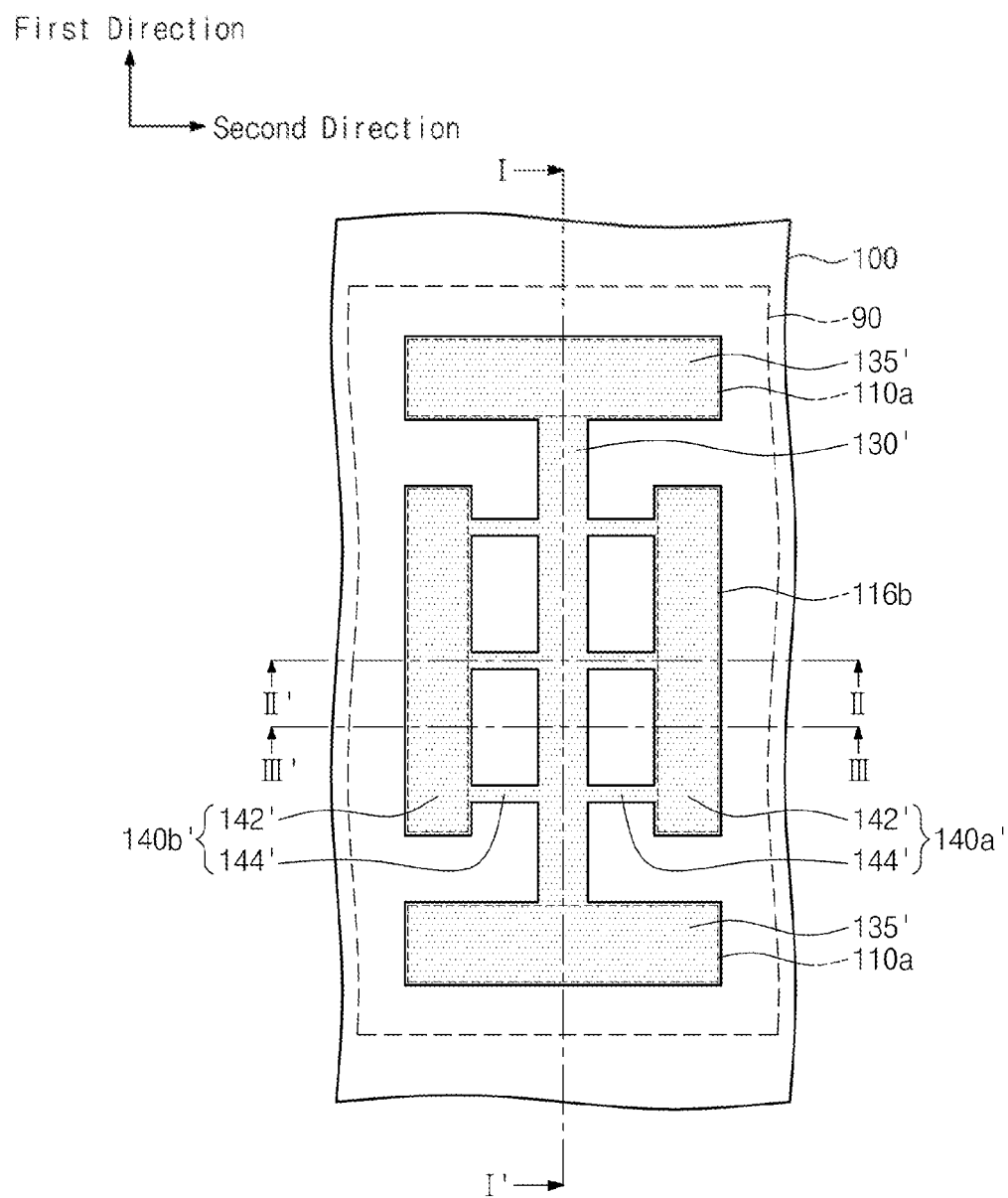
FIG. 7A is a plan view illustrating a semiconductor device according to an embodiment of the present invention.
Figure 7B:
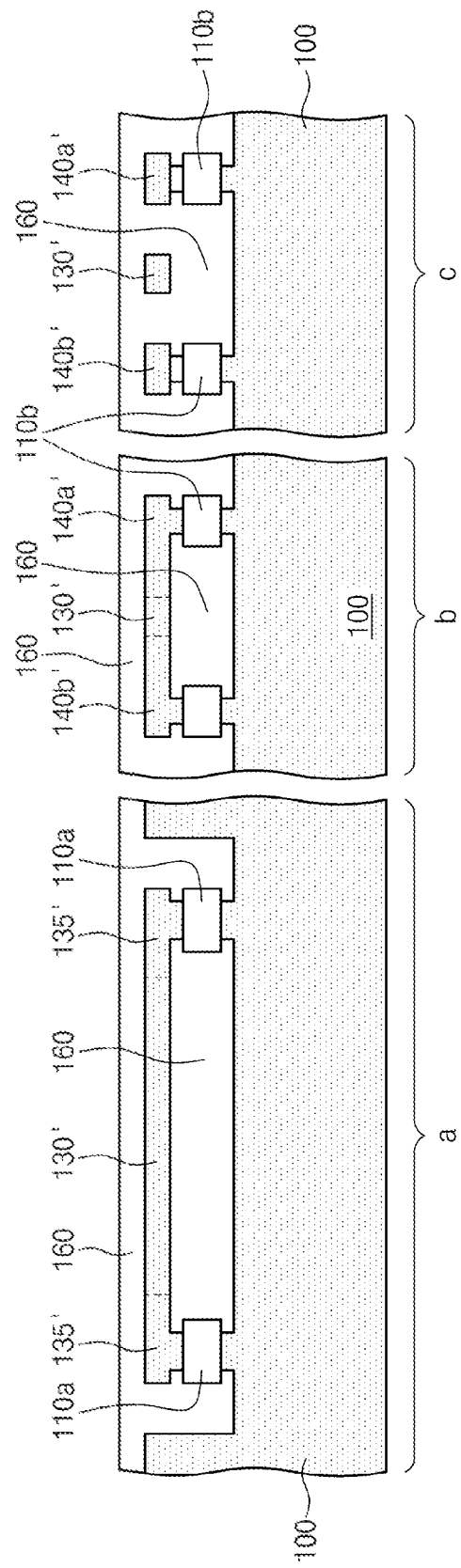
FIG. 7B is a sectional view taken along the lines I-I', II-II', and III-III' of FIG. 7A.

Next, a second buried oxide layer 160 of FIG. 7B is formed to fill the empty region 150 between the core semiconductor pattern 130 and the semiconductor substrate 100. Thereby, a semiconductor device of FIGS. 7A and 7B can be realized. A second buried oxide layer will be described in more detail with reference to FIGS. 7A and 7B.

Referring to FIGS. 7A and 7B, the second buried oxide layer 160 may be formed through a thermal oxidation process. Accordingly, the bottom portion of the core semiconductor pattern 130 and the top surface of the substrate 100 below the core semiconductor pattern 130 are oxidized. As a result, the second buried oxide layer 160 is formed thicker than the anchor and support buried oxide patterns 110a and 110b. Additionally, since the second buried oxide layer 160 is formed through a thermal oxidation process, it has more excellent characteristics compared to the first buried oxide layer 110 formed using the SIMOX method.

Due to the thermal oxidation process, the sidewalls and the top surface of the core semiconductor pattern 130 may be oxidized. Furthermore, the exposed top surface and sidewalls of the anchor and support-semiconductor patterns 135, 140a, and 140b may be oxidized. In FIGS. 7A and 7B, the reference numbers 130', 142', 140a', 140b', and 135' refer to a core semiconductor pattern 130', a body portion 142', a first support-semiconductor pattern 140a', a second support-semiconductor pattern 140b', and a anchor-semiconductor pattern 135', respectively, after the second buried oxide layer 160 is formed using the thermal oxidation process.

As mentioned above, since the core semiconductor pattern 130' is surrounded by the second buried oxide layer 160 having an excellent characteristic, reliability of a semiconductor device including the core semiconductor pattern 130' can be more improved.

Meanwhile, the support-semiconductor patterns 140a and 140b may be formed with another form. Modifications of the support-semiconductor patterns 140a and 140b are described with reference to the drawings.

Figure 4:
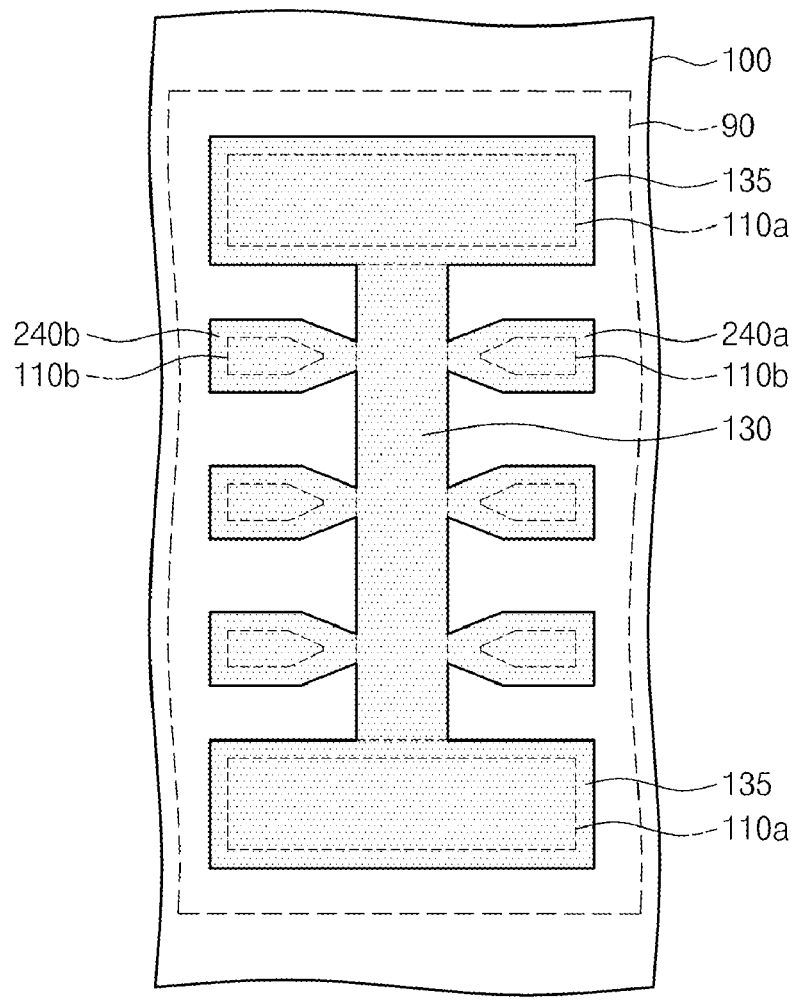
FIG. 4 is a plan view illustrating one modification of the support-semiconductor pattern in a method of forming another semiconductor device according to an embodiment of the present invention.

FIG. 4 is a plan view illustrating one modification of the support-semiconductor pattern in a method of forming another semiconductor device according to an embodiment of the present invention.

Referring to FIG. 4, a first support-semiconductor pattern 240a may be disposed at the first side of the core semiconductor pattern 130 to contact the first sidewall of the core semiconductor pattern 130, and a second support-semiconductor pattern 240b may be disposed at the second side of the core semiconductor pattern 130 to contact the second sidewall of the core semiconductor pattern 130. The core semiconductor pattern 130 extends in a first direction, and the first support-semiconductor pattern 240a may extend in a second direction perpendicular to the first direction.

The first support-semiconductor pattern 240a may include a first portion and a second portion. The first portion of the first support-semiconductor pattern 240a may substantially have a uniform width. The second portion of the first support-semiconductor pattern 240a is interposed between the first portion of the first support-semiconductor pattern 240a and the core semiconductor pattern 130. The second portion of the first support-semiconductor pattern 240a may have a tapered shape. Especially, a surface of the second portion of the first support-semiconductor pattern 240a, contacting the core semiconductor pattern 130, may be narrower than a surface of the second portion of the first support-semiconductor pattern 240a, contacting the first portion.

The second support-semiconductor pattern 240b may be symmetric to the first support-semiconductor pattern 240a with respect to the core semiconductor pattern 130. The first and second support-semiconductor patterns 240a and 240b may overlap each other in the second direction. The first and second support-semiconductor patterns 240a and 240b overlapping each other in the second direction is defined as a support group. The support group may be provided in plurality on the semiconductor substrate 100. The plurality of support groups may be spaced apart from each other in the first direction.

FIG. 4 illustrates a view right after a process for removing the first buried oxide layer 110 below the core semiconductor pattern 130 is performed. A support buried oxide pattern 110b is disposed between each of the support-semiconductor patterns 240a and 240b and the semiconductor substrate 100. A second buried oxide layer for filling between the core semiconductor pattern 130 and the semiconductor substrate 100 is formed on the modification of FIG. 4 by performing the thermal oxidation process that is described with reference to FIGS. 3A, 3B, 7A, and 7B. Thereby, a semiconductor device of FIG. 10 may be realized.

Figure 5:
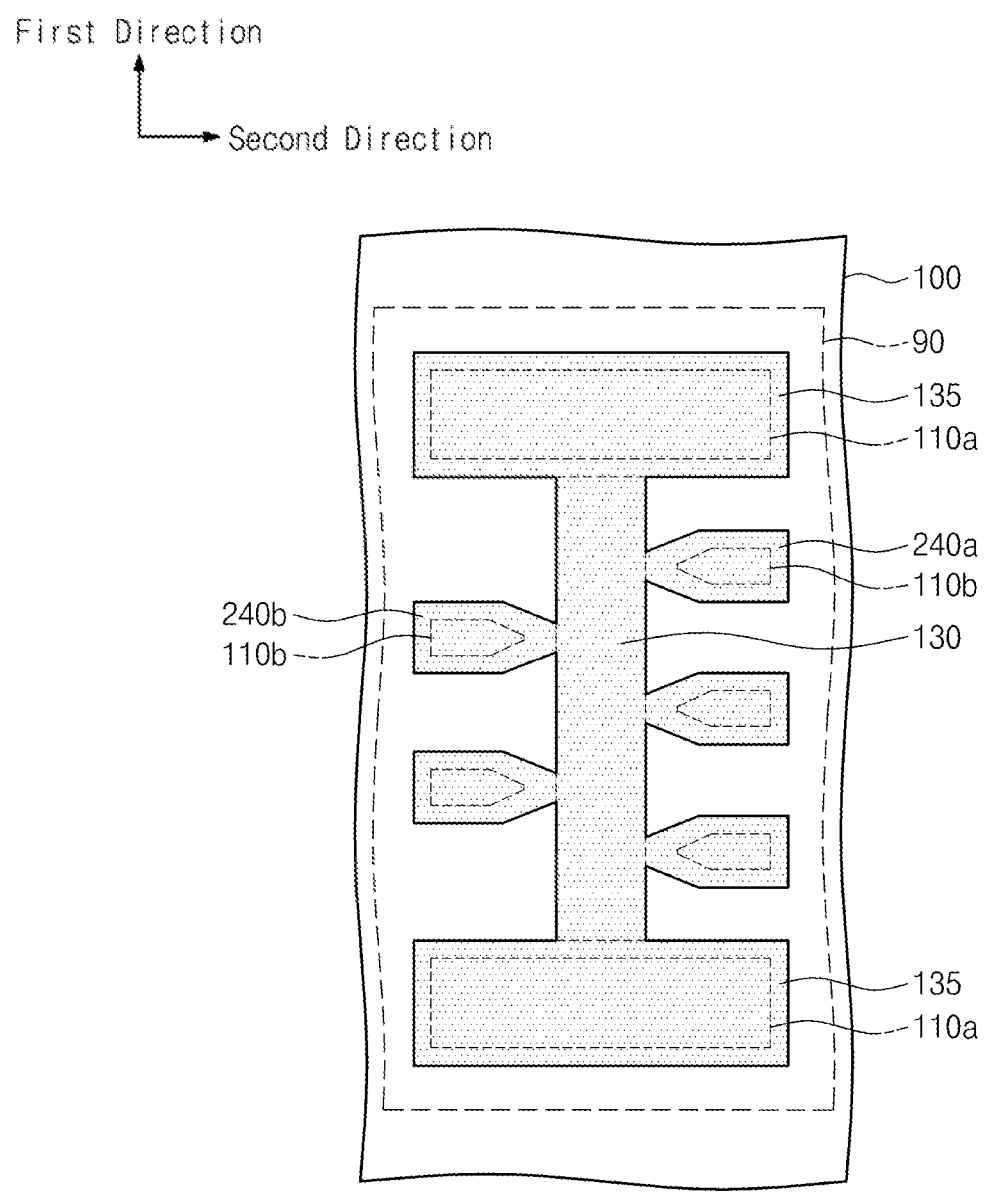
FIG. 5 is a plan view illustrating another modification of a support-semiconductor pattern in a method of forming a semiconductor device according to an embodiment of the present invention.

FIG. 5 is a plan view illustrating another modification of a support-semiconductor pattern in a method of forming a semiconductor device according to an embodiment of the present invention.

Referring to FIG. 5, FIG. 5 illustrates a view right after a process for removing the first buried oxide layer 110 below the core semiconductor pattern 130 is performed. Forms of the first and second support-semiconductor patterns 240a and 240b according to this modification may be the same as FIG. 4.

However, according to this modification, the first and second support-semiconductor patterns 240a and 240b may not overlap in a direction perpendicular to the longitudinal direction of the core semiconductor pattern 130. That is, the first and second support-semiconductor patterns 240a and 240b may be arranged in a zigzag form along the longitudinal direction of the core semiconductor pattern 130. In this case, an interval between portions of the core semiconductor pattern 130, contacting the adjacent first and second support-semiconductor patterns 240a and 240b respectively, may be reduced more compared to FIG. 4. Accordingly, the supporting power to the core semiconductor pattern 130 can be more improved. A second buried oxide layer for filling between the core semiconductor pattern 130 and the semiconductor substrate 100 is formed by performing the thermal oxidation process (which is described with reference to FIGS. 3A, 3B, 7A, and 7B) on the modification of FIG. 5. Thereby, a semiconductor device of FIG. 11 can be realized.

Figure 6A:
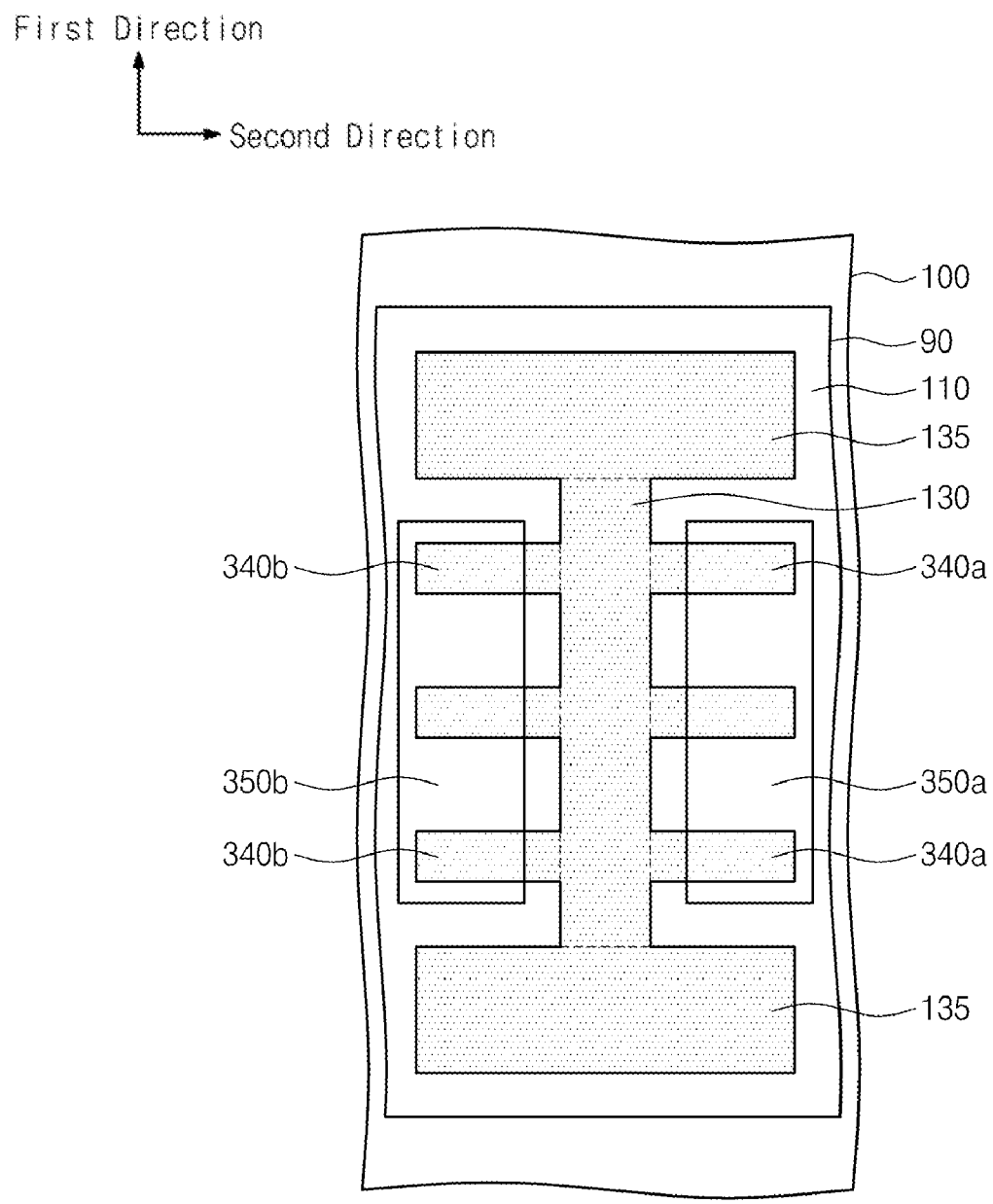
FIGS. 6A and 6B are plan views illustrating a method of removing a portion of the buried oxide layer by using further another modification of the support-semiconductor pattern in a method of forming a semiconductor device according to an embodiment of the present invention.
Figure 6B:
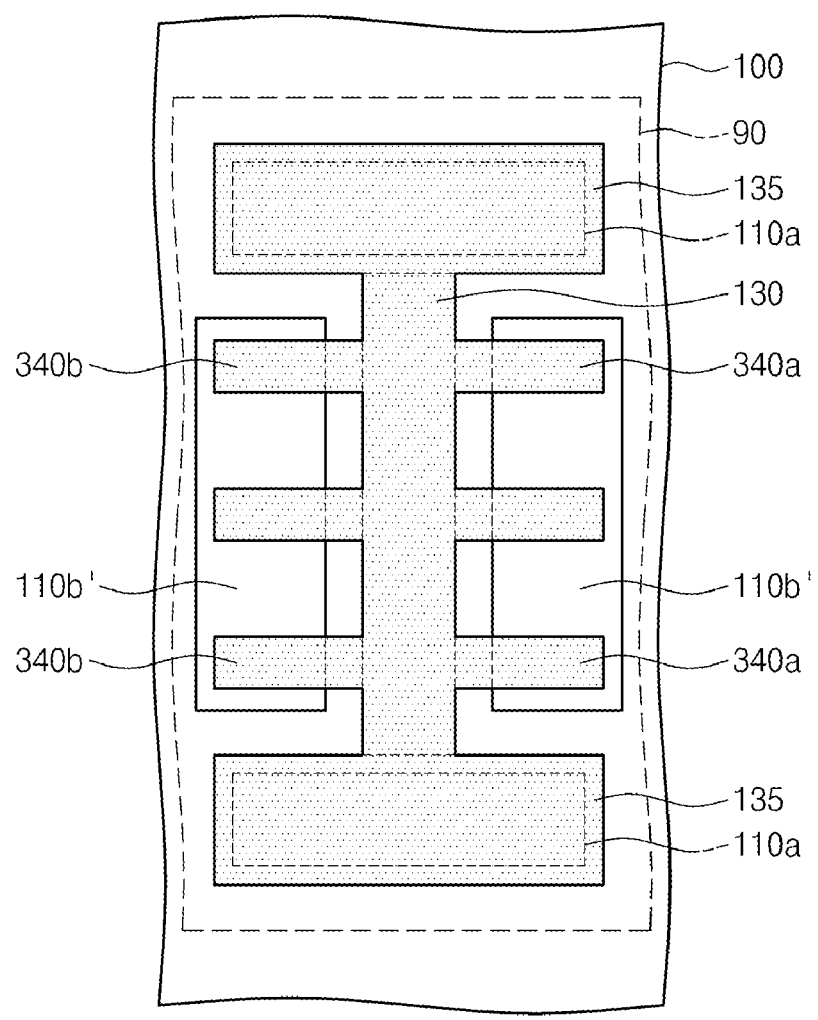

FIGS. 6A and 6B are plan views illustrating a method of removing a portion of the buried oxide layer by using further another modification of the support-semiconductor pattern in a method of forming a semiconductor device according to an embodiment of the present invention.

Referring to FIG. 6A, FIG. 6A is a plan view right after a semiconductor layer is patterned to expose a first buried oxide layer 110. As mentioned above, the core semiconductor pattern 130 may extend in the first direction. A first support-semiconductor pattern 340a may be disposed on the first buried oxide layer 110 at the first side of the core semiconductor pattern 130 such that it contacts the first sidewall of the core semiconductor pattern 130. The first support-semiconductor pattern 340a may extend in a second direction perpendicular to the first direction. The first support-semiconductor pattern 340a may be a rectangle form having a substantially uniform width. The width of the first support-semiconductor pattern 340a along the first direction may be less than the width Wa (FIG. 3A) of the core semiconductor pattern 130 along the second direction. The first support-semiconductor pattern 340a may be provided in plurality at the first side of the core semiconductor pattern 130.

A second support-semiconductor pattern 340b may be disposed at the second side of the core semiconductor pattern 130 to contact the second sidewall of the core semiconductor pattern 130. The second support-semiconductor pattern 340b extends in the second direction, and may be a rectangle form having a substantially uniform width. The second support-semiconductor pattern 340b may be symmetrical to the first support-semiconductor pattern 340a with respect to the core semiconductor pattern 130.

The widths of the first and second support-semiconductor patterns 340a and 340b along the first direction may be less than the width of the core semiconductor pattern 130 along the second direction. In this case, before removing of the first buried oxide layer 110 below the core semiconductor pattern 130, a first etching mask pattern 350a covering the first support-semiconductor pattern 340a and a second etching mask pattern 350b covering the second support-semiconductor pattern 340b may be formed.

A width of the first etching mask pattern 350a along the first direction and a width of the first etching mask pattern 350a along the second direction may be greater than the width of the core semiconductor pattern 130 along the second direction. The first etching mask pattern 350a may cover the plurality of first support mask patterns 340a. Likewise, the widths of the second etching mask pattern 350b along the first and second directions may be greater than the width of the core semiconductor pattern 130 along the second direction. The second etching mask pattern 350b may cover the plurality of second support mask patterns 340b. The first and second etching mask patterns 350a and 350b may be spaced from the left and right of the core semiconductor pattern 130.

Referring to FIG. 6B, an isotropic etching process is performed on the semiconductor substrate 110 having the first and second etching mask patterns 350a and 350b to remove the first buried oxide layer 110 below the core semiconductor pattern 130. The isotropic etching process may be performed being identical to the isotropic etching process described with reference to FIGS. 3A and 3B.

After the performing of the isotropic etching process, a support buried oxide pattern 110b' remains below each of the first and second support-semiconductor patterns 340a and 340b because of the etching mask patterns 350a and 350b. One of the support buried oxide patterns 110b' may be interposed between the plurality of first support-semiconductor patterns 340a and the semiconductor substrate 100 and the other of the support buried oxide patterns 110b' may be interposed between the plurality of second support-semiconductor patterns 340b and the semiconductor substrate 100.

Next, the etching mask patterns 350a and 350b are removed, and then a second buried oxide layer is formed performing the thermal oxidation process that is described with reference to FIGS. 3A, 3B, 7A, and 7B. Therefore, a semiconductor device of FIG. 12 may be realized.

Next, a semiconductor device according to an embodiment of the present invention will be described with reference to the drawings. For convenience of description, the above-mentioned second buried oxide layer 160 is defined as a core buried oxide layer 160.

FIG. 7A is a plan view illustrating a semiconductor device according to an embodiment of the present invention. FIG. 7B is a sectional view taken along the lines I-I', II-II', and III-III' of FIG. 7A.

Referring to FIGS. 7A and 7B, a core semiconductor pattern 130' having a line form is disposed on the semiconductor substrate 100. The core semiconductor pattern 130' may extend in a first direction parallel to the top surface of the semiconductor substrate 100. A pair of anchor-semiconductor patterns 135' contacts the both ends of the core semiconductor pattern 130', respectively. A first support-semiconductor pattern 140a' is disposed on the semiconductor substrate 100 at the first side of the core semiconductor pattern 130', and a second support-semiconductor pattern 140b' is disposed on the semiconductor substrate 100 at the second side of the core semiconductor pattern 130'. The core semiconductor pattern 130', the anchor-semiconductor patterns 135', and the first and second support-semiconductor patterns 140a' and 140b' are substantially disposed at the same level from a top surface of the semiconductor substrate 100.

An anchor buried oxide pattern 110a is interposed between the semiconductor substrate 100 and each of the anchor-semiconductor patterns 135', and a support buried oxide pattern 110b is interposed between the semiconductor substrate 100 and each of the first and second support-semiconductor patterns 140a' and 140b'. The core buried oxide layer 160 is interposed between the core semiconductor pattern 130' and the semiconductor substrate 100. The core buried oxide layer 160 between the core semiconductor pattern 130' and the semiconductor substrate 100 is thicker than the anchor and support buried oxide patterns 110a and 110b.

The core buried oxide layer 160 may extend to cover the both sidewalls and top surface of the core semiconductor pattern 130'. Additionally, the core buried oxide layer 160 may extend to cover the both sidewalls of the anchor and support-semiconductor patterns 135', 140a', and 140b'. Furthermore, the core buried oxide layer 160 may extend to be interposed between the semiconductor substrate 100 and the edge of the bottom surface of each anchor-semiconductor pattern 135'. Likewise, the core buried oxide layer 160 may extend to be interposed between the semiconductor substrate 100 and the edge of the bottom surface of the first support-semiconductor pattern 140a'. In addition, the core buried oxide layer 160 may extend to be interposed between the semiconductor substrate 100 and the edge of the bottom surface of the second support-semiconductor pattern 140b'.

The core buried oxide layer 160 may be formed of a thermal oxide that is formed using a thermal oxidation process, and the anchor and support-semiconductor patterns 110a and 110b may be formed of an oxide formed using the SIMOX method. Each of the first and second support-semiconductor patterns 140a' and 140b' may include a body portion of a rectangle form extending in the first direction and a connection portion extending laterally from the body portion to contact one sidewall of the core semiconductor pattern 130'.

The core semiconductor pattern 130' and the core buried oxide layer 160 surrounding the core semiconductor pattern 130' may be an optical waveguide for delivering an optical signal. Although not shown, the optical waveguide may be mounted with additional electrodes and/or diffraction gratings. Accordingly, the optical waveguide may be used as an optical modulator or an optical coupler, etc.

According to one embodiment of the present invention, as shown in the drawings, the core buried oxide layer 160 may extend to cover top surfaces of the anchor-semiconductor pattern 135' and the support-semiconductor patterns 140a' and 140b'.

Unlike this, the core buried oxide layer 160 on the top surfaces of the anchor and support-semiconductor patterns 135', 140a', and 140b' may be removed. This will be described with reference to the drawings.

Figure 8:
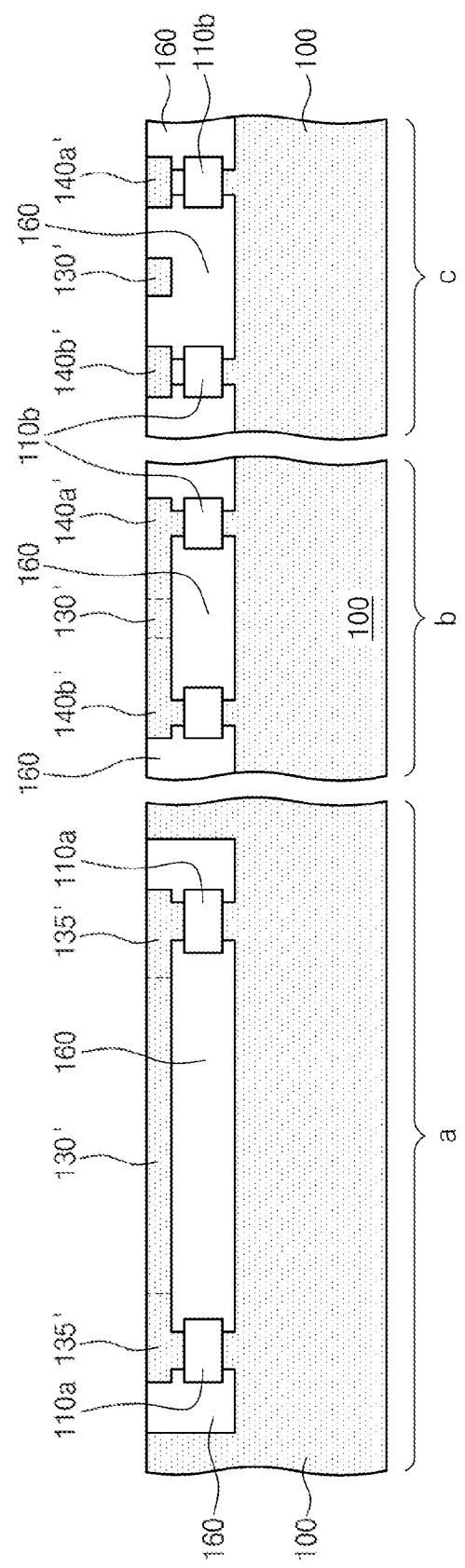
FIG. 8 is a sectional view taken along the lines I-I', and III-II' of FIG. 7A to illustrate one modification of a semiconductor device according to an embodiment of the present invention.

FIG. 8 is a sectional view taken along the lines I-I', II-II', and III-III' of FIG. 7A to illustrate one modification of a semiconductor device according to an embodiment of the present invention.

Referring to FIG. 8, the core buried oxide layer 160 may not exist on the top surfaces of the core semiconductor pattern 130', the anchor-semiconductor patterns 135', and the support-semiconductor patterns 140a' and 140b'. The core buried oxide layer 160 shown in FIG. 7B may be planarized to expose the top surfaces of the semiconductor patterns 130', 135', 140a', and 140b', such that the semiconductor device of FIG. 8 may be realized. In this case, the core semiconductor pattern 130' and the core buried oxide layer 160 surrounding the both sidewalls and the bottom surface of the core semiconductor pattern 130' may constitute an optical waveguide. A Complementary Metal-Oxide Semiconductor (CMOS) device may be formed on the anchor and support-semiconductor patterns 135', 140a' and 140b'.

According to one embodiment of the present invention, the core buried oxide layer 160 may only extend to cover the top surface of the core semiconductor pattern 130'. In this case, the core buried oxide layer 160 may not exit on the anchor and support-semiconductor patterns 135', 140a' and 140b'. This may be realized by removing the core buried oxide layer 160 on the anchor and support-semiconductor patterns 135', 140a' and 140b' while the core buried oxide layer 160 on the core semiconductor pattern 130' remains in the semiconductor device of FIG. 7B.

In addition, the support-semiconductor patterns 140a' and 140b' may be realized with another form. These modifications are described with reference to the drawings.

Figure 9:
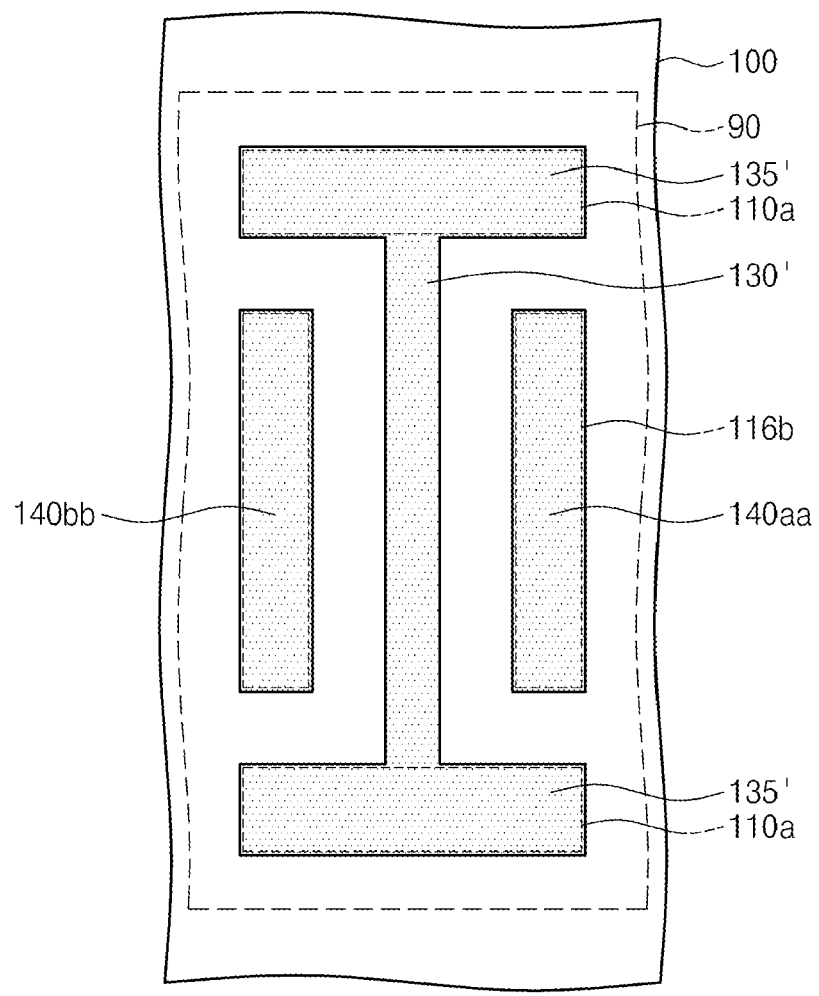
FIG. 9 is a plan view illustrating another modification of a semiconductor device according to an embodiment of the present invention.

FIG. 9 is a plan view illustrating another modification of a semiconductor device according to an embodiment of the present invention.

Referring to FIG. 9, the semiconductor device according to this modification may include a first support-semiconductor pattern 140aa disposed at the first side of the core semiconductor pattern 130' and a second support-semiconductor pattern 140bb disposed at the second side of the core semiconductor pattern 130'. The first and second support-semiconductor patterns 140aa and 140bb may be spaced apart from the core semiconductor pattern 130'. In this case, the core buried oxide layer 160 extends to be interposed between the first support-semiconductor pattern 140aa and the core semiconductor pattern 130' and between the second support-semiconductor pattern 140bb and the core semiconductor pattern 130'.

The semiconductor device shown in FIG. 9 may be realized by adjusting the width Wc of the connection portion 142 shown in FIG. 2A. Specifically, during the above thermal oxidation process for forming the core buried oxide layer 160, the width Wc of the connection portion 142 can be adjusted to oxidize the connection portion 142. For example, the width Wc of the connection portion 142 may be less than the two times of a oxidized thickness of the core semiconductor pattern 130 in FIGS. 3A and 3B.

Figure 10:
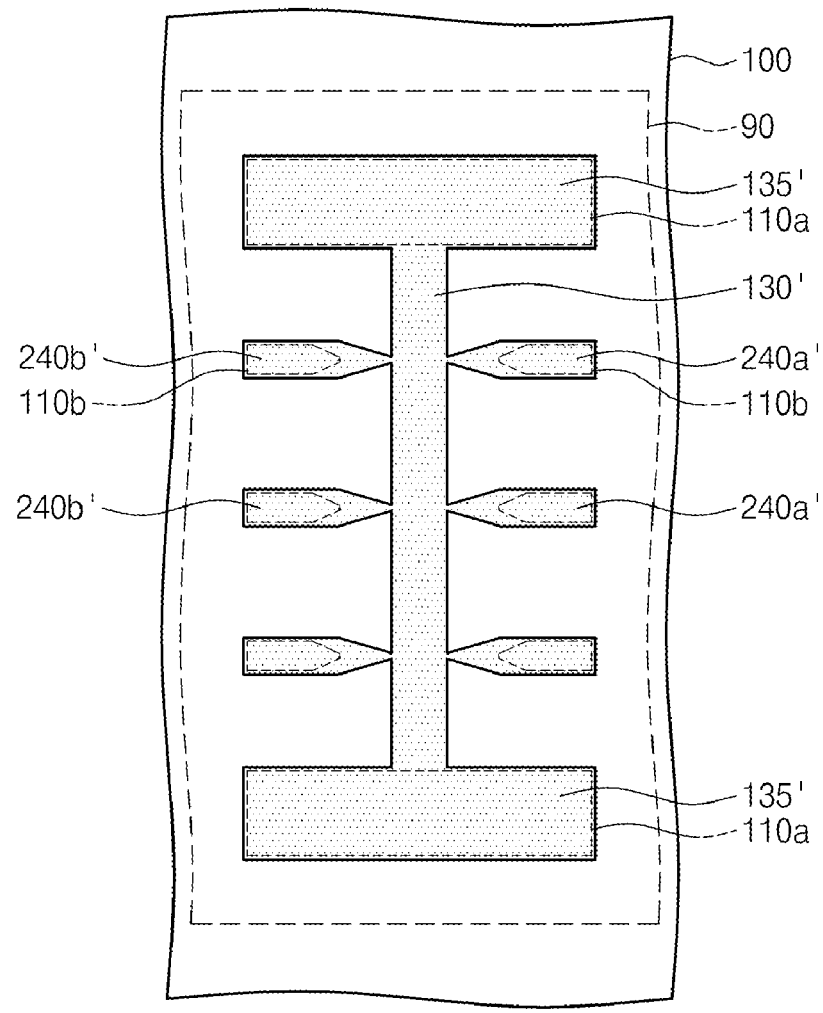
FIG. 10 illustrates further another modification of a semiconductor device according to an embodiment of the present invention.
Figure 11:
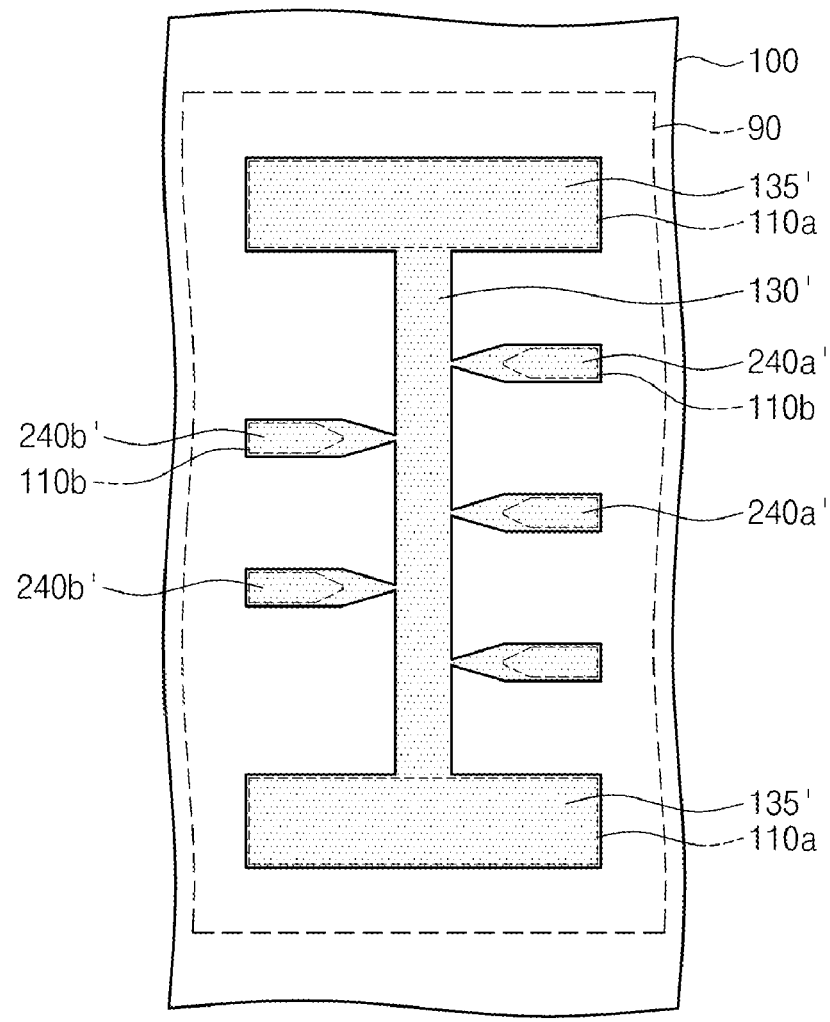
FIG. 11 illustrates further another modification of a semiconductor device according to an embodiment of the present invention.

FIGS. 10 and 11 are plan views illustrating further another embodiment of a semiconductor device according to an embodiment of the present invention.

Referring to FIG. 10, the semiconductor device according to this modification may include a first support-semiconductor pattern 240a' contacting the first sidewall of the core semiconductor pattern 130' and a second support-semiconductor pattern 240b' contacting the second sidewall of the core semiconductor pattern 130'.

The first support-semiconductor pattern 240a' may include a first portion having a substantially uniform width and a second portion interposed between the first portion and the core semiconductor pattern 130'. The second portion may have a tapered form. The second support-semiconductor pattern 240b' may be symmetric to the first support-semiconductor pattern 240a' with respect to the core semiconductor pattern 130'. The first and second support-semiconductor patterns 240a' and 240b' may overlap each other in a second direction perpendicular to the longitudinal direction of the core semiconductor pattern 130'. That is, the first and second support-semiconductor pattern 240a' and 240b' are arranged along the second direction to form one row.

As shown in the drawing, the first support-semiconductor pattern 240a' may contact the first sidewall of the core semiconductor pattern 130'. Unlike this, the first support-semiconductor pattern 240a' may be spaced apart from the core semiconductor pattern 130'. In this case, an extension portion of the core buried oxide layer 160 may disposed between the first support-semiconductor pattern 240a' and the core semiconductor pattern 130'. A portion of the first support-semiconductor pattern 240a shown in FIG. 4, adjacent to the core conductive pattern 130, may be completely oxidized by the above mentioned thermal oxidation process. Likewise, the second support-semiconductor pattern 240b' may contact the second sidewall of the core semiconductor pattern 130' or may be spaced apart from the second sidewall.

According to one embodiment of the present invention, as shown in FIG. 11, the first and second support-semiconductor patterns 240a' and 240b' may not overlap each other in the second direction.

Figure 12:
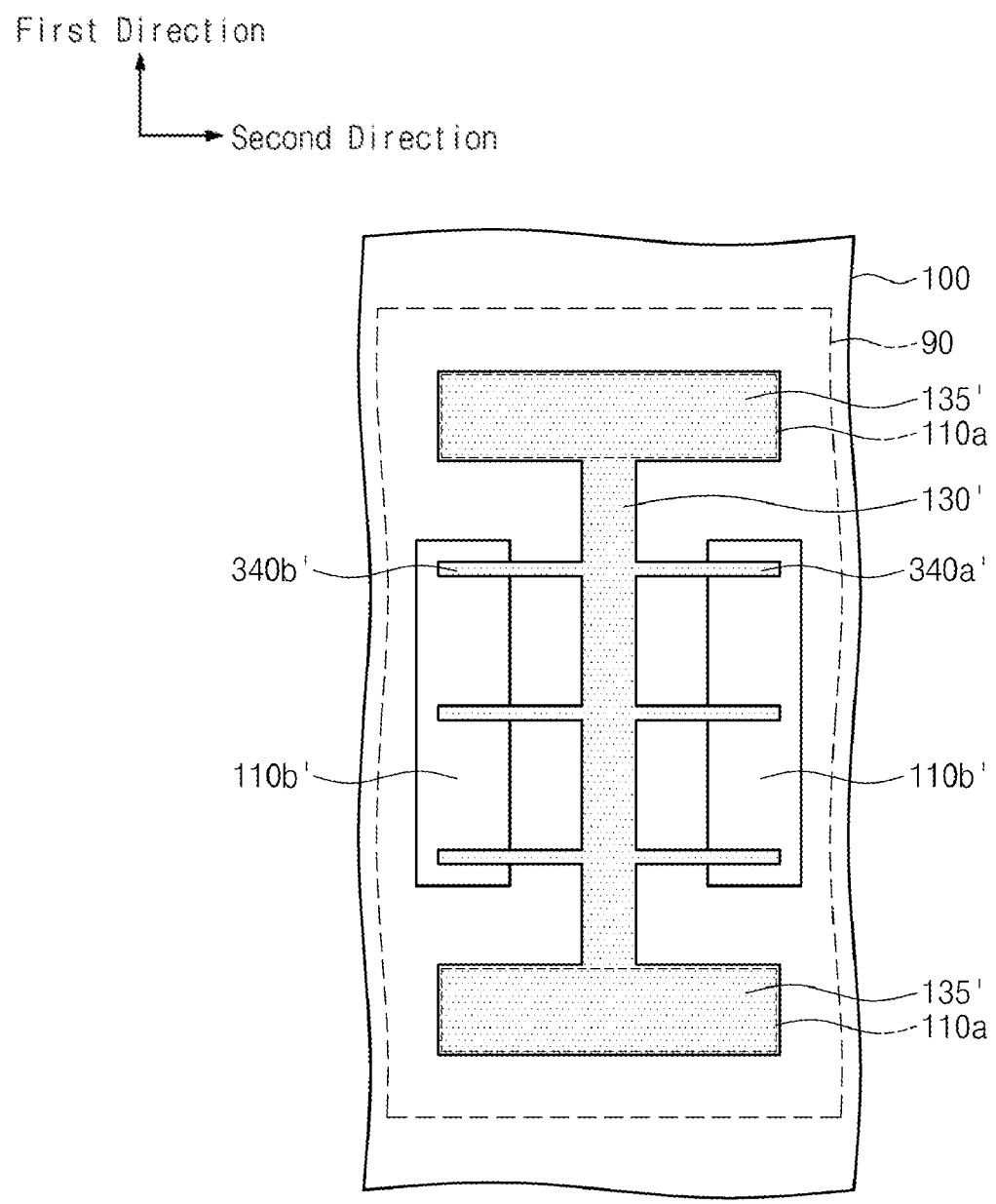
FIG. 12 illustrates further another modification of a semiconductor device according to an embodiment of the present invention.

FIG. 12 is a plan view illustrating further another modification of a semiconductor device according to an embodiment of the present invention.

Referring to FIG. 12, the first support-semiconductor pattern 340a' may be a rectangle form that extends in the second direction perpendicular to the longitudinal direction of the core semiconductor pattern 130'. The first support-semiconductor pattern 340' may contact the first sidewall of the core semiconductor pattern 130'. The second support-semiconductor pattern 340b' may contact the second sidewall of the core semiconductor pattern 130'. The second support-semiconductor pattern 340b' may be symmetric to the first support-semiconductor pattern 340a' with respect to the core semiconductor pattern 130'.

According to one embodiment of the present invention, a support buried oxide pattern 110b' below the first support-semiconductor pattern 340a' may be interposed between a plurality of the first support-semiconductor patterns 340a' and the semiconductor substrate 100. Likewise, the support buried oxide pattern 110b' below the second support-semiconductor pattern 340b' may be interposed between a plurality of the second support-semiconductor patterns 340b' and the semiconductor substrate 100.

According to the above-mentioned embodiments of the present invention, after a first buried oxide layer below a core semiconductor pattern is removed, the core semiconductor pattern of a line form is supported by the support-semiconductor pattern. Accordingly, a bending phenomenon of a core semiconductor can be minimized. As a result, a semiconductor device having excellent reliability can be realized.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of forming a semiconductor device, the method comprising:
    forming a first buried oxide layer locally in a semiconductor substrate;
    forming a core semiconductor pattern of a line form, a pair of anchor-semiconductor patterns contacting both ends of the core semiconductor pattern, respectively, and a support-semiconductor pattern contacting one sidewall of the core semiconductor pattern by patterning a semiconductor layer on the first buried oxide layer to expose the first buried oxide layer;
    removing the first buried oxide layer below the core semiconductor pattern by performing an isotropic etching process and leaving a portion of the first buried oxide layer below each of the anchor-semiconductor patterns and a portion of the first buried oxide layer below the support-semiconductor pattern; and
    forming a second buried oxide layer filling a region where the first buried oxide layer below the core semiconductor pattern is removed, the second buried oxide layer surrounding the core semiconductor pattern.

2. The method of claim 1, wherein the second buried oxide layer is formed by a thermal oxidation process.

3. The method of claim 2, wherein the support-semiconductor pattern contacts the core semiconductor pattern after the forming of the second buried oxide layer.

4. The method of claim 2, wherein a portion of the support-semiconductor pattern, adjacent to the core semiconductor pattern, is completely oxidized by the thermal oxidation process.

5. The method of claim 1, wherein a thickness of a portion of the second buried oxide layer between the core semiconductor pattern and the substrate is formed thicker than a thickness of the first buried oxide layer.

6. The method of claim 1, wherein the support-semiconductor pattern comprises a body portion and a plurality of connection portions that extend from the body portion and contact the one sidewall of the core semiconductor pattern, and wherein the plurality of connection portions are spaced apart from each other.

7. The method of claim 1, wherein:
    the support-semiconductor pattern extends in a direction perpendicular to a longitudinal direction of the core semiconductor pattern;
    the support-semiconductor pattern includes a first portion having a uniform width and a second portion interposed between the first portion and the core semiconductor pattern and having a tapered form; and
    a surface of the second portion contacting the core semiconductor pattern is narrower than a surface of the second portion contacting the first portion.

8. The method of claim 1, wherein the support-semiconductor pattern is a rectangle form that extends in a direction perpendicular to a longitudinal direction of the core semiconductor pattern.

9. The method of claim 1, wherein:
    the support-semiconductor pattern is formed in plural on the semiconductor substrate;
    the core semiconductor pattern includes a first sidewall and a second sidewall facing each other; and
    the support-semiconductor patterns include a first support-semiconductor pattern contacting the first sidewall and a second support-semiconductor pattern contacting the second sidewall.

10. The method of claim 9, wherein the first support-semiconductor pattern and the second support-semiconductor pattern overlap each other in a direction perpendicular to a longitudinal direction of the core semiconductor pattern.

11. The method of claim 9, wherein the first support-semiconductor pattern and the second support-semiconductor pattern do not overlap in a direction perpendicular to the longitudinal direction of the core semiconductor pattern.

12. The method of claim 1, wherein the first buried oxide layer is formed using a Separation by IMplanted OXgen (SIMOX) method.

13. The method of claim 1, further comprising:
    after the forming of the second buried oxide layer, exposing the top surface of the core semiconductor pattern by removing a portion of the second buried oxide layer on the top surface of the core semiconductor pattern.

14. The method of claim 1, wherein the isotropic etching process comprises a wet etching process and a dry isotropic etching process, which are sequentially performed.

* * * * *